United States Patent
Isobe

(10) Patent No.: US 7,961,516 B2
(45) Date of Patent: Jun. 14, 2011

(54) NAND FLASH MEMORY AND MEMORY SYSTEM

(75) Inventor: Katsuaki Isobe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 107 days.

(21) Appl. No.: 12/327,136

(22) Filed: Dec. 3, 2008

(65) Prior Publication Data

US 2009/0147581 A1 Jun. 11, 2009

(30) Foreign Application Priority Data

Dec. 6, 2007 (JP) ................. 2007-315549

(51) Int. Cl.
*G11C 11/34* (2006.01)
(52) U.S. Cl. ............... 365/185.17; 365/185.24
(58) Field of Classification Search ............. 365/185.17, 365/185.24
See application file for complete search history.

(56) References Cited

U.S. PATENT DOCUMENTS

| | | | |
|---|---|---|---|
| 6,188,603 B1 | 2/2001 | Takeda | |
| 7,493,531 B2* | 2/2009 | Ito et al. | 714/708 |
| 2003/0033549 A1* | 2/2003 | Liu | 713/300 |
| 2006/0227611 A1* | 10/2006 | Lee | 365/185.17 |
| 2007/0113108 A1* | 5/2007 | Lien | 713/300 |
| 2007/0263439 A1 | 11/2007 | Cornwell et al. | |

FOREIGN PATENT DOCUMENTS

| | | |
|---|---|---|
| JP | 2000-173275 | 6/2000 |
| KR | 10-0370909 | 10/2000 |
| KR | 10-2004-0077423 | 9/2004 |
| KR | 10-2007-0010137 | 1/2007 |

OTHER PUBLICATIONS

Office Action issued Jun. 25, 2010, in Korean Patent Application No. 10-2008-0122939 (with English-language Translation).
Office Action issued on Jan. 20, 2011 in Korean Patent Application No. 10-2008-0122939 (with English Translation) 5 pages.

* cited by examiner

*Primary Examiner* — Michael T Tran
(74) *Attorney, Agent, or Firm* — Oblon, Spivak, McClelland, Maier & Neustadt, L.L.P.

(57) ABSTRACT

A NAND flash memory comprising blocks which are units of writing and deletion of data, the block comprising: memory cells from which data corresponding to values of held threshold voltages can be read by applying a reading voltage to control gates of the memory cells; source-side selection gate transistors connected between a common source line and the memory cells; drain-side selection gate transistors connected between a bit line and the memory cells; and monitor cells which are configured as the memory cells and have a threshold voltage set according to monitor data, and from which data corresponding to values of held threshold voltages can be read by applying a decision voltage to control gates of the monitor cells.

16 Claims, 4 Drawing Sheets

NAND FLASH MEMORY AND MEMORY SYSTEM

CROSS-REFERENCE TO RELATED APPLICATION

This application is based upon and claims the benefit of priority from the prior Japanese Patent Application No. 2007-315549, filed on Dec. 6, 2007, the entire contents of which are incorporated herein by reference.

BACKGROUND OF THE INVENTION

1. Field of the Invention

The present invention relates to a NAND flash memory and a memory system.

2. Background Art

In a nonvolatile memory cell of a NAND flash memory and so on, electrons are trapped in an oxide film by applying a high electric field. Thus the threshold voltage of the memory cell is changed and data is written according to the threshold voltage, and then the data is read using a difference in the threshold voltage.

When the electrons are permanently trapped in the oxide film, the data is held without any problems. However, the electrons trapped in the oxide film are drawn to a stable neutral threshold voltage with the passage of time.

The drawing of electrons changes the threshold voltage of the memory cell. Thus the data is erroneously read and problems occur when the data is held.

Even if the threshold voltage can be set at a higher threshold distribution to write data, the probability of erroneous writing may increase. For this reason, the threshold voltage cannot be set at quite a high threshold distribution to write data.

Therefore, for example, in the case of multilevel data which is octal or hexadecimal, an interval between threshold distributions is smaller than in binary or four-valued data. Although binary or four-valued data is not disadvantageous, octal or hexadecimal data is more likely to cause some problems when the data is held.

In a NAND flash memory, for example, two memory cells M0 and M31 disposed on both ends of 32 memory cells connected in series are respectively adjacent to a source-side selection gate transistor SGS which is connected between the memory cells and a common source line and a drain-side selection transistor SGD which is connected between the other end of the memory cells and a bit line.

Therefore, when writing is not performed on the memory cells M0 and M31, the memory cells M0 and M31 are respectively adjacent to the source-side selection gate transistor SGS biased to 0 V (VSGD) and the drain-side selection transistor SGD connected between the other end of the memory cells and the bit line.

Thus, for example, a high electric field of a boosted channel and a ground VSS is applied between the source-side selection gate transistor SGS and the memory cell M0, so that tunnel current is generated and erroneous writing occurs on the memory cell M0. The same problem may occur between the drain-side selection transistor SGD and the memory cell M31.

This phenomenon is more likely to occur as a writing voltage increases and a distance between the source-side selection gate transistor SGS and the memory cell M0 decreases (between the drain-side selection transistor SGD and the memory cell M31).

In recent years, a distance between a memory cell and the source-side selection gate transistor SGS (drain-side selection transistor SGD) has been reduced in response to smaller design rules of semiconductor process technology.

Consequently, erroneous writing is more likely to occur.

Thus in the prior art, for example, cells adjacent to the source-side selection gate transistor SGS and a memory cell M (drain-side selection transistor SGD) are dummy cells.

A NAND flash memory of the prior art includes, for example, a monitor bit having a smaller threshold margin in data holding characteristics than in a nonvolatile memory cell used for reading and writing data (for example, see Japanese Patent Laid-Open No. 2000-173275).

In the NAND flash memory of the prior art, when defective data is detected in the monitor bit, a sector containing the monitor bit is replaced with another sector.

SUMMARY OF THE INVENTION

According to one aspect of the present invention, there is provided: a NAND flash memory comprising blocks which are units of writing and deletion of data, the block comprising:

memory cells from which data corresponding to values of held threshold voltages can be read by applying a reading voltage to control gates of the memory cells;

source-side selection gate transistors connected between a common source line and the memory cells;

drain-side selection gate transistors connected between a bit line and the memory cells; and monitor cells which are configured as the memory cells and have a threshold voltage set according to monitor data, and from which data corresponding to values of held threshold voltages can be read by applying a decision voltage to control gates of the monitor cells, wherein first data corresponding to the values of the threshold voltages held by the monitor cells is read by applying the decision voltage to the control gates of the monitor cells, second data stored in all the memory cells in the block is read according to a result of comparison between the first data read from the monitor cells and the monitor data, and the second data is stored again in the memory cells of the block or another block.

According to another aspect of the present invention, there is provided: a memory system comprising:

a NAND flash memory comprising blocks which are units of writing and deletion of data, the block comprising: memory cells from which data corresponding to values of held threshold voltages can be read by applying a reading voltage to control gates of the memory cells; source-side selection gate transistors connected between a common source line and the memory cells; drain-side selection gate transistors connected between a bit line and the memory cells; and monitor cells which are configured as the memory cells and have a threshold voltage set according to monitor data, and from which data corresponding to values of held threshold voltages can be read by applying a decision voltage to control gates of the monitor cells; and a controller having an ECC correcting circuit for correcting, based on redundant data, the data read from the memory cells, wherein the NAND flash memory reads first data corresponding to the values of the threshold voltages held by the monitor cells, by applying the decision voltage to the control gates of the monitor cells, and the controller compares the first data read from the monitor cells and the monitor data, reads, according to a comparison result, second data stored in all the memory cells in the block, corrects, based on the redundant data by the ECC correcting circuit, the second data read from the memory cells, and stores the corrected second data again in the memory cells in the block or another block.

DETAILED DESCRIPTION

In a NAND flash memory according to an aspect of the present invention, dummy cells not used as data regions are used as monitor cells for monitoring a data holding margin. The NAND flash memory compares the data of the monitor cells and an expected value. When a margin is not found, the data is read and the monitor cells are rewritten, so that the monitor cells are refreshed.

An embodiment to which the present invention is applied will be described below with reference to the accompanying drawings.

First Embodiment

Figure 1:
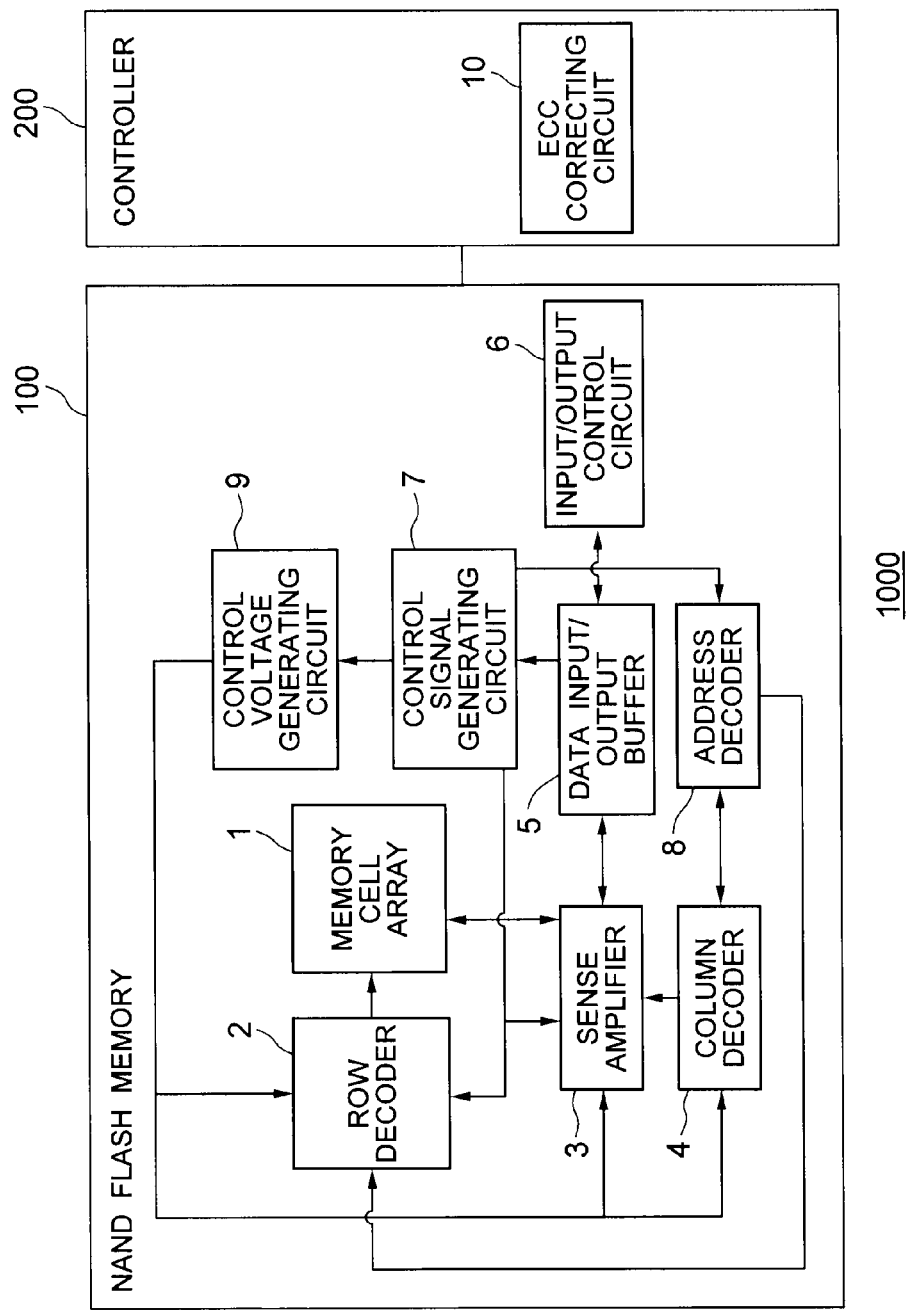
FIG. 1 is a block diagram showing the main configuration of a memory system 1000 according to a first embodiment which is an aspect of the present invention.
Figure 2:
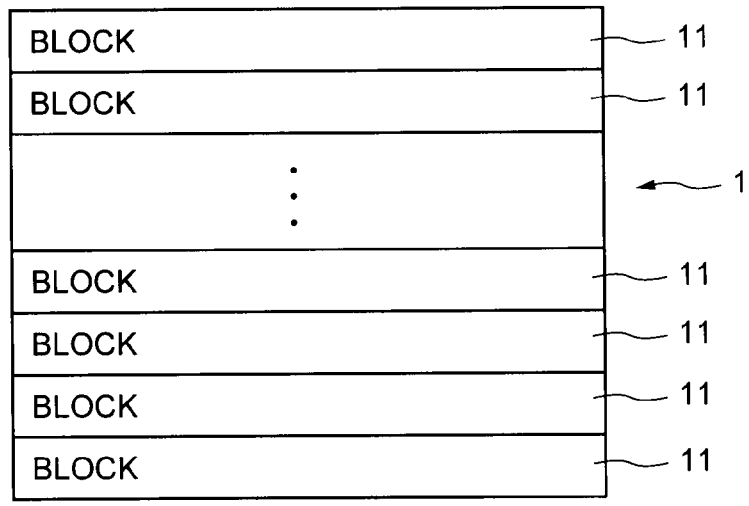
FIG. 2 is a block diagram showing the configuration of a memory cell array 1 shown in FIG. 1.
Figure 3:
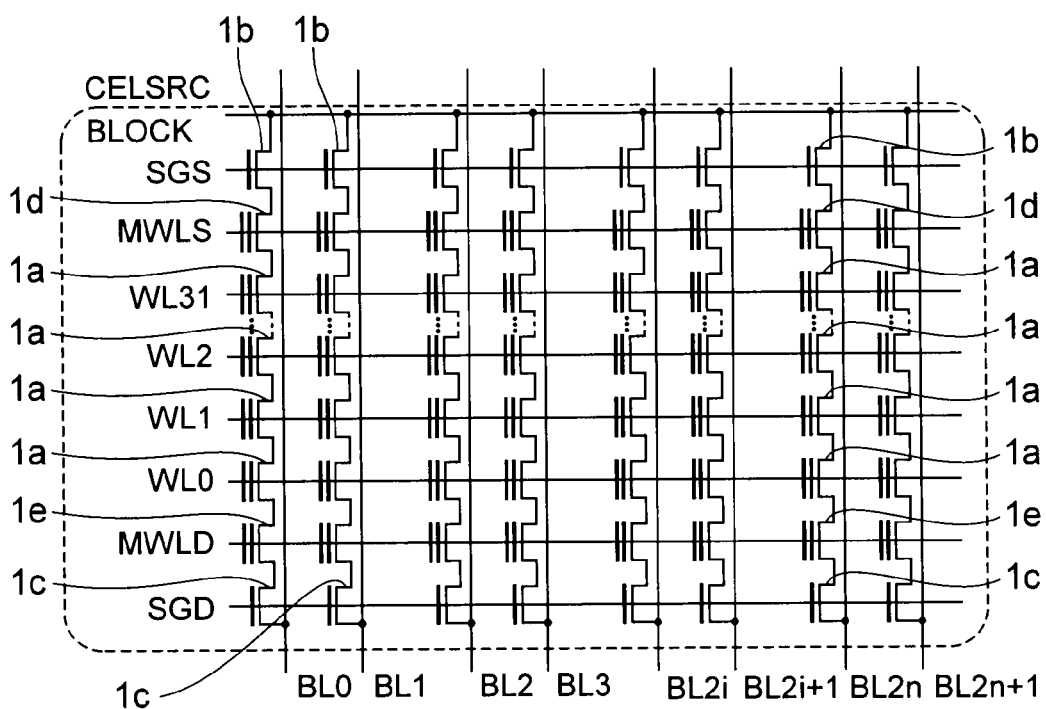
FIG. 3 is a circuit diagram showing the main configuration of a block of the memory cell array 1 shown in FIG. 2.

FIG. 1 is a block diagram showing the main configuration of a memory system 1000 according to a first embodiment which is an aspect of the present invention. FIG. 2 illustrates the configuration of a memory cell array 1 shown in FIG. 1. FIG. 3 is a circuit diagram showing the main configuration of a block of the memory cell array 1 shown in FIG. 2.

As shown in FIG. 1, the memory system 1000 includes a NAND flash memory 100 and a controller 200.

The NAND flash memory 100 includes the memory cell array 1, a row decoder 2, a sense amplifier 3, a column decoder 4, a data input/output buffer 5, an input/output control circuit 6, a control signal generating circuit 7, an address decoder 8, and a control voltage generating circuit 9.

The controller 200 includes an ECC correcting circuit 10.

As shown in FIG. 2, the memory cell array 1 is made up of a plurality of blocks 11 which are units of writing/deletion of data.

For example, the block 11 includes, as shown in FIG. 3, a plurality of memory cells (NAND cells) 1a which are connected to word lines WL1 to WL31 provided along selection rows and bit lines BL0 to BL2n+1 (n is an integer not smaller than 0) provided along selection columns, and are arranged in a matrix form.

The memory cells 1a store information data, which is multivalued data, according to threshold voltages. The information data can be read from the memory cells 1a by applying a reading voltage to the word lines WL1 to WL 31. In other words, the information data corresponding to the value of the held threshold voltage can be read from the memory cell 1a by applying the reading voltage to the control gate of the memory cell 1a. For example, when the held threshold voltage is higher than the reading voltage, the read information data has a logical value of "0". When the held threshold voltage is lower than the reading voltage, the read information data has a logical value of "1".

The block 11 of the memory cell array 1 includes source-side selection gate transistors 1b for connecting a common source line CELSRC and the memory cells 1a. The source-side selection gate transistors 1b have the gates connected to a source-side selection gate line SGS and are controlled by applying a voltage from the row decoder 2 to the source-side selection gate line SGS.

The block 11 further includes drain-side selection gate transistors 1c for connecting the bit lines BL0 to BL2n+1 and the memory cells 1a. The drain-side selection gate transistors 1c have the gates connected to a drain-side selection gate line SGD and are controlled by applying a voltage from the row decoder 2 to the drain-side selection gate line SGD.

Moreover, the block 11 includes first monitor cells 1d and second monitor cells 1e.

The first monitor cells 1d are connected between the source-side selection gate transistors 1b and the memory cells 1a. The first monitor cells 1d are controlled by applying a voltage from the row decoder 2 to a word line MWLS connected to the control gates of the first monitor cells 1d.

In other words, in the first monitor cell 1d, data corresponding to the value of the held threshold voltage can be read by setting (writing) a threshold voltage (monitor threshold voltage) corresponding to set monitor data, and applying a decision voltage to the control gate of the first monitor cell 1d. For example, when the held threshold voltage is higher than the decision voltage, the read data has a logical value of "0". When the held threshold voltage is lower than the decision voltage, the read data has a logical value of "1".

By turning on the first monitor cells 1d and the source-side selection gate transistors 1b, the common source line CELSRC and the memory cells 1a are electrically connected to each other.

The second monitor cells 1e are connected between the drain-side selection gate transistors 1c and the memory cells 1a. The second monitor cells 1e are controlled by applying a voltage from the row decoder 2 to a word line MWLD connected to the control gates of the second monitor cells 1e.

In other words, in the second monitor cell 1e, data corresponding to the value of the held threshold voltage can be read by setting (writing) the threshold voltage (monitor threshold voltage) corresponding to the set monitor data, and applying the decision voltage to the control gate of the second monitor cell 1e. For example, when the held threshold voltage is higher than the decision voltage, the read data has a logical value of "0". When the held threshold voltage is lower than the decision voltage, the read data has a logical value of "1".

By turning on the second monitor cells 1e and the drain-side selection gate transistors 1c, the common source line CELSRC and the memory cells 1a are electrically connected to each other.

The first and second monitor cells 1d and 1e are configured as the memory cells 1a.

The memory cells 1a are connected in series between the first monitor cells 1d and the second monitor cells 1e.

The block 11 can be monitored when at least one of the first monitor cells 1d and the second monitor cells 1e are disposed in the block 11.

As described above, the row decoder 2 is connected to the word lines. The row decoder 2 includes a word line drive circuit (not shown) and selects and drives the word lines of the memory cell array 1.

In other words, the row decoder 2 controls a writing operation and a reading operation by applying a voltage from the word lines WL0 to WL31 to the memory cells 1a and the gates of the selection gate transistors 1b and 1c of the memory cell array 1. The row decoder 2 supplies the voltage thus to the word lines WL0 to WL31 and operates the memory cells 1a.

The sense amplifier 3 is connected to the data input/output buffer 5. The bit lines BL0 to BL2n+1 are connected to the sense amplifier 3.

The sense amplifier 3 controls the memory cell array 1 in the column direction. To be specific, the sense amplifier 3 controls a writing operation and a reading operation by charging the bit lines BL0 to BL2n+1. The bit lines BL0 to BL2n+1 of the memory cell array 1 are selected by the column decoder 4.

As described above, the sense amplifier 3 is connected to the bit lines of the memory cell array 1, reads data stored in the memory cells 1a and the first and second monitor cells 1d and 1e, and holds the read data and data written in the memory cells 1a and the first and second monitor cells 1d and 1e.

When data is read, the data read by the sense amplifier 3 is outputted to the input/output control circuit 6 through the data input/output buffer 5.

The input/output control circuit 6 supplies a command to the control signal generating circuit 7 through the data input/output buffer 5. The control signal generating circuit 7 decodes the command.

Further, the control signal generating circuit 7 is fed with external control signals including a chip enable signal CE, a writing enable signal WE, a reading enable signal RE, an address latch enable signal ALE, and a command latch enable signal CLE.

The control signal generating circuit 7 controls sequences of writing and deleting data and controls reading of data, based on the external control signals and the command which are supplied according to an operation mode.

The control signal generating circuit 7 outputs signals for controlling the operations of reading, writing, and deletion. In response to the signals, the control voltage generating circuit 9 generates voltages for the respective operations.

The addresses of the memory cells 1a and the first and second monitor cells 1d and 1e are supplied from the controller 200 to the NAND flash memory. These addresses are supplied from the input/output control circuit 6 to the sense amplifier 3 and the control signal generating circuit 7 through the data input/output buffer 5. Further, the addresses are transferred to the row decoder 2 and the column decoder 4 through the address decoder 8.

When data is inputted, information data inputted from the outside is read to the ECC correcting circuit 10. The ECC correcting circuit 10 generates redundant data based on the information data. Further, the ECC correcting circuit 10 forms a data correcting unit which is called an ECC frame and is made up of the information data and the redundant data. The ECC frame outputted from the ECC correcting circuit 10 is inputted to the input/output control circuit 6 of the NAND flash memory 100 and is stored in the memory cells 1a.

To the controller 200, address data and command data are inputted in addition to the information data. The address data and the command data are used in the NAND flash memory 100 together with the external control signals. The data is directly inputted to the input/output control circuit 6 of the NAND flash memory 100 through a bus (not shown) because it is not necessary to generate a code word.

On the other hand, the information data outputted from the memory cells 1a of the NAND flash memory 100 is inputted to the ECC correcting circuit 10. The ECC correcting circuit 10 corrects the information data based on the redundant data.

Although the present embodiment illustrates the configuration in which the ECC correcting circuit 10 is provided in the controller 200, the ECC correcting circuit 10 may be provided also in the NAND flash memory 100. When using the NAND flash memory 100 for a multichip, one ECC correcting circuit is enough in the controller 200.

The NAND flash memory 100 configured thus applies the decision voltage to the control gates of the first and second monitor cells 1d and 1e, so that data corresponding to the values of the threshold voltages held by the first and second monitor cells 1d and 1e is read. Further, the NAND flash memory 100 reads data stored in all the memory cells in the block 11, based on a comparison result of the data read from the first and second monitor cells 1d and 1e and the monitor data. After that, the NAND flash memory 100 stores the read data again in the memory cells 1a in the block 11 or another block 11.

The following will describe a principle of estimating a margin for holding data in the memory cells of the overall block by monitoring the data held in the monitor cells of the same block.

Figure 4:
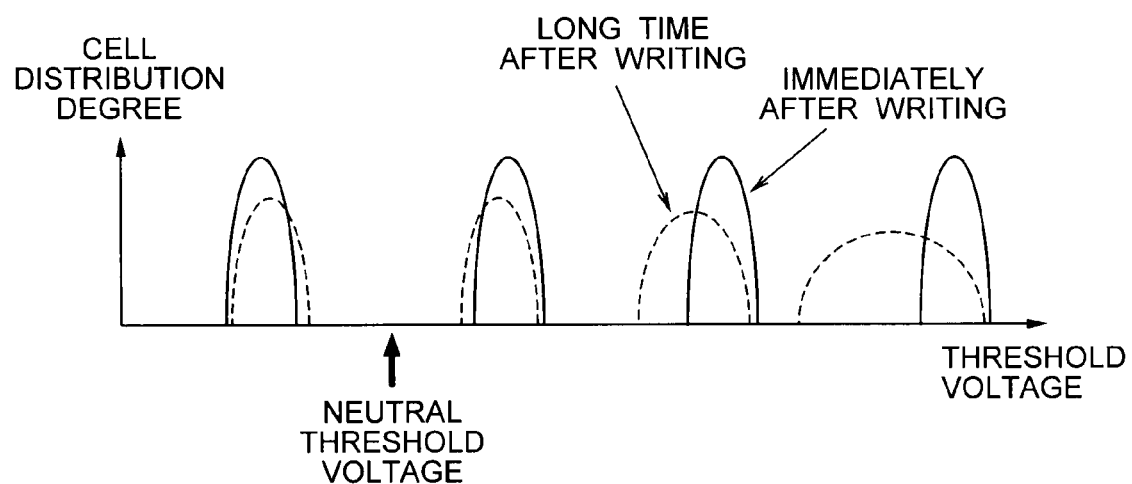
FIG. 4 is a graph showing a threshold voltage immediately after writing on the memory cell and a threshold voltage after a long time has elapsed since writing on the memory cell.

FIG. 4 illustrates a threshold voltage immediately after writing on the memory cell and a threshold voltage after a long time has elapsed since writing on the memory cell.

As described above, the NAND flash memory 100 deletes and writes data in blocks. Therefore, data in the same block has been written at the same time.

Moreover, electrons trapped in the oxide film of the memory cell 1a are drawn to a stable neutral threshold voltage with the passage of time. Thus the threshold voltage immediately after writing on the memory cell changes so as to shift to the neutral threshold voltage (FIG. 4) after a long time has elapsed since writing on the memory cell.

Figure 5:
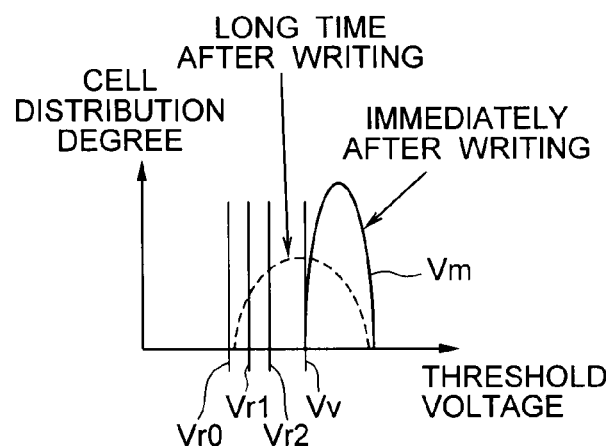
FIG. 5 is a graph showing a threshold voltage immediately after writing on the monitor cell, a threshold voltage after a long time has elapsed since writing on the monitor cell, and decision voltages.

FIG. 5 illustrates a threshold voltage immediately after writing on the monitor cell, a threshold voltage after a long time has elapsed since writing on the monitor cell, and decision voltages.

As shown in FIG. 5, the threshold voltage of the monitor cell is set at a monitor threshold voltage Vm which is equal to or higher than a verification voltage Vv. In the memory cell of another data region, desired data is simultaneously written by setting a desired threshold voltage. Immediately after the writing operation, for example, data read from the monitor cell according to the decision voltage has a logical value of, for example, "0" which is equal to the logical value of the monitor data.

After that, the monitor cell is read according to decision voltages Vr0, Vr1 and Vr2 (in the case of a threshold voltage distribution higher than the neutral threshold voltage: the decision voltages Vr0, Vr1 and Vr2<the verification voltage Vv).

As in the memory cell, electrons trapped in the oxide film of the monitor cell are drawn to the stable neutral threshold voltage with the passage of time, so that the threshold voltage of the monitor cell decreases. Thus when reading at the decision voltages Vr0, Vr1 and Vr2, some of the monitor cells may have threshold voltages lower than the decision voltages Vr0, Vr1 and Vr2. In other words, data read according to the decision voltages may have logical values of "1" in some of the monitor cells. This means that data read according to the decision voltages may have logical values "1" different from the logical value "0" of the monitor data.

The presence or absence of a margin for holding data in the memory cell is determined by the number of monitor cells having threshold voltages lower than the decision voltages (data read according to the decision voltages is different from the monitor data) and the set range and so on of the decision voltage. Based on these determination conditions, it is possible to estimate a margin for holding data in the overall block at that time.

For example, when the number of monitor cells having threshold voltages lower than the decision voltages exceeds a predetermined number (a set determination condition), a margin for holding data in the memory cells in the block is absent and thus there is a high possibility of data corruption caused by aged deterioration in a data region in the block.

Thus data stored in the memory cells in the block is read before exceeding the set determination conditions. The read data may be written on top of data in the same block or may be written in another block.

At this point, a threshold voltage (monitor threshold voltage) corresponding to the monitor data is simultaneously written on the monitor cells.

In other words, in the case of a small margin for holding data in the monitor cells, data in the block is read and the block is rewritten with the data.

The NAND flash memory 100 refreshes the memory cells thus in the block.

A plurality of (in this case, three) decision voltages may be set. Thus a margin for holding data in the memory cells can be determined in more detail. In this case, the determination conditions are set according to the plurality of set decision voltages.

Further, the monitor threshold voltage set for the monitor cells is a predetermined voltage. A margin for holding data varies with the set monitor threshold voltage and thus the set monitor threshold voltage may have more than one level. For example, the monitor threshold voltage may be set at two levels or four levels. In other words, the monitor threshold voltage may vary among the monitor cells.

The level of the monitor threshold voltage is changed and a margin for holding data is monitored at each threshold voltage level, thereby increasing the accuracy of determination.

However, the NAND flash memory 100 has to store the level of the written monitor threshold voltage and which one of the monitor cells has been written with the monitor threshold voltage.

In this case, for example, the level of the monitor threshold voltage is changed for each IO address or each column address. Thus the relationship between the level of the monitor threshold voltage and the address has regularity.

It is therefore possible to eliminate a memory region for storage in the NAND flash memory 100.

The following will describe an example of the operation of the memory system 1000 configured thus.

For example, in a device in which data holding characteristics are likely to deteriorate, it is necessary to increase a redundant memory for correcting deterioration.

However, if data can be refreshed before the data holding characteristics of the NAND flash memory deteriorate, the ECC correcting circuit of the controller can be reduced in size with a small redundant memory.

Thus in the present embodiment, data rewritten during refreshing may be data having been corrected by the ECC correcting circuit.

Figure 6:
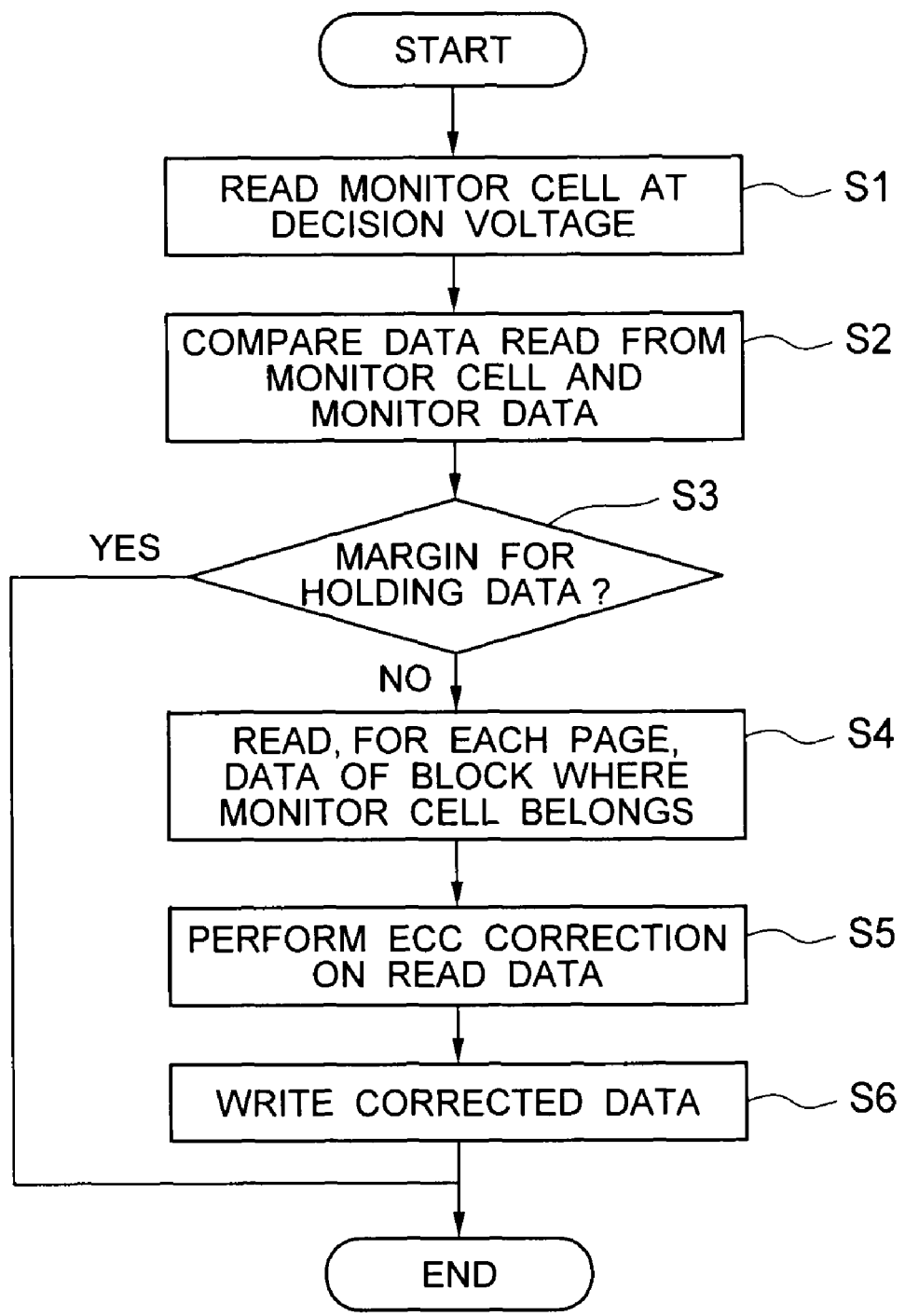
FIG. 6 is a flowchart showing an example of the operation of the memory system 1000 according to the first embodiment.

FIG. 6 is a flowchart showing an example of the operation of the memory system 1000 according to the first embodiment.

It is assumed that during writing of data, threshold voltages corresponding to desired data are set for the memory cells and monitor threshold voltages are set for the monitor cells in the same block.

During refreshing of data, first, the NAND flash memory 100 applies the decision voltage to the control gates of the monitor cells, so that data corresponding to the values of the threshold voltages held by the monitor cells is read (step S1).

Next, the controller 200 compares data read from the monitor cells and the monitor data (step S2).

The NAND flash memory 100 may compare the data read from the memory cells and the monitor data.

Next, when the controller 200 decides that a margin for holding data is present as a result of the comparison, it is not particularly necessary to refresh the memory cells and thus the process is completed (step S3).

When the controller 200 decides that a margin for holding data is absent as a result of the comparison, the controller 200 reads data stored in the memory cells in the block where the monitor cells belong (step S4).

As described above, the presence or absence of a margin for holding data in the memory cells is determined by the set range of the decision voltage and the number of monitor cells having threshold voltages lower than the decision voltage.

For example, when the number of monitor cells having threshold values lower than the decision voltage exceeds the predetermined number (a set determination condition), it is decided that a margin for holding data in the memory cells in the block is absent. When the number of monitor cells having threshold voltages lower than the decision voltage is smaller than the predetermined number, it is decided that a margin for holding data in the memory cells in the block is present.

Next, the controller 200 corrects the data read from the memory cells, by the ECC correcting circuit based on the redundant data (step S5). When the ECC correcting circuit is provided in the NAND flash memory 100, the data read from the memory cells may be corrected by the ECC correcting circuit in the NAND flash memory 100.

Next, the controller 200 stores the corrected data again in the memory cells in the block or another block.

Thus the data stored in the memory cells in the block is refreshed, thereby improving the reliability of the data.

The monitor cells in all the blocks may be accessed to check whether or not data in the blocks has a margin for holding data. When it is decided that one of the blocks has a small margin for holding data in the memory cells as a result of the check, data stored in the memory cells of the block may be refreshed, for example, according to the flow of FIG. 6.

As described above, the NAND flash memory and the memory system according to the present embodiment can improve the reliability of data stored in the memory cells.

What is claimed is:

1. A NAND flash memory comprising blocks which are units of writing and deletion of data,
the block comprising:
memory cells from which data corresponding to values of held threshold voltages can be read by applying a reading voltage to control gates of the memory cells;
source-side selection gate transistors connected between a common source line and the memory cells;
drain-side selection gate transistors connected between a bit line and the memory cells; and
monitor cells which are configured as the memory cells and have a threshold voltage set according to monitor data, and from which data corresponding to values of held threshold voltages can be read by applying a decision voltage to control gates of the monitor cells, wherein first data corresponding to the values of the threshold voltages held by the monitor cells is read by applying the decision voltage to the control gates of the monitor cells, the first data being read from the monitor cells and the monitor data are compared with each other, second data stored in all the memory cells in the block is read according to a result of comparison between the first data read from the monitor cells and the monitor data, and the second data is stored again in the memory cells of the block or another block.

2. The NAND flash memory according to claim 1, wherein the monitor cells are connected at least between the source-side selection gate transistors and the memory cells or between the drain-side selection gate transistors and the memory cells.

3. The NAND flash memory according to claim 1, wherein the monitor threshold voltage varies among the monitor cells.

4. The NAND flash memory according to claim 2, wherein the monitor threshold voltage varies among the monitor cells.

5. The NAND flash memory according to claim 1, wherein, the second data stored in all the memory cells in the block is read when the number of monitor cells having threshold voltages lower than the decision voltage exceeds a predetermined number, and the second data is stored again in the memory cells in the block or another block.

6. The NAND flash memory according to claim 2, wherein, the second data stored in all the memory cells in the block is read when the number of monitor cells having threshold voltages lower than the decision voltage exceeds a predetermined number, and the second data is stored again in the memory cells in the block or another block.

7. The NAND flash memory according to claim 3, wherein, the second data stored in all the memory cells in the block is read when the number of monitor cells having threshold voltages lower than the decision voltage exceeds a predetermined number, and the second data is stored again in the memory cells in the block or another block.

8. The NAND flash memory according to claim 4, wherein, the second data stored in all the memory cells in the block is read when the number of monitor cells having threshold voltages lower than the decision voltage exceeds a predetermined number, and the second data is stored again in the memory cells in the block or another block.

9. A memory system comprising:
a NAND flash memory comprising blocks which are units of writing and deletion of data, the block comprising: memory cells from which data corresponding to values of held threshold voltages can be read by applying a reading voltage to control gates of the memory cells; source-side selection gate transistors connected between a common source line and the memory cells; drain-side selection gate transistors connected between a bit line and the memory cells; and monitor cells which are configured as the memory cells and have a threshold voltage set according to monitor data, and from which data corresponding to values of held threshold voltages can be read by applying a decision voltage to control gates of the monitor cells; and a controller having an ECC correcting circuit for correcting, based on redundant data, the data read from the memory cells, wherein the NAND flash memory reads first data corresponding to the values of the threshold voltages held by the monitor cells, by applying the decision voltage to the control gates of the monitor cells, and the controller compares the first data read from the monitor cells and the monitor data, reads, according to a comparison result, second data stored in all the memory cells in the block, corrects, based on the redundant data by the ECC correcting circuit, the second data read from the memory cells, and stores the corrected second data again in the memory cells in the block or another block.

10. The memory system according to claim 9, wherein the monitor cells are connected at least between the source-side selection gate transistors and the memory cells or between the drain-side selection gate transistors and the memory cells.

11. The memory system according to claim 9, wherein the monitor threshold voltage varies among the monitor cells.

12. The memory system according to claim 10, wherein the monitor threshold voltage varies among the monitor cells.

13. The memory system according to claim 9, wherein the first data read from the monitor cells and the monitor data are compared with each other, the second data stored in all the memory cells in the block is read when the number of monitor cells having threshold voltages lower than the decision voltage exceeds a predetermined number, and the second data is stored again in the memory cells in the block or another block.

14. The memory system according to claim 10, wherein the first data read from the monitor cells and the monitor data are compared with each other, the second data stored in all the memory cells in the block is read when the number of monitor cells having threshold voltages lower than the decision voltage exceeds a predetermined number, and the second data is stored again in the memory cells in the block or another block.

15. The memory system according to claim 11, wherein the first data read from the monitor cells and the monitor data are compared with each other, the second data stored in all the memory cells in the block is read when the number of monitor cells having threshold voltages lower than the decision voltage exceeds a predetermined number, and the second data is stored again in the memory cells in the block or another block.

16. The memory system according to claim 12, wherein the first data read from the monitor cells and the monitor data are compared with each other, the second data stored in all the memory cells in the block is read when the number of monitor cells having threshold voltages lower than the decision voltage exceeds a predetermined number, and the second data is stored again in the memory cells in the block or another block.

* * * * *